(12) United States Patent
Abdel-Hafez et al.

(10) Patent No.: US 7,590,905 B2
(45) Date of Patent: *Sep. 15, 2009

(54) METHOD AND APPARATUS FOR PIPELINED SCAN COMPRESSION

(75) Inventors: Khader S. Abdel-Hafez, San Francisco, CA (US); Laung-Terng (L.-T.) Wang, Sunnyvale, CA (US); Boryau (Jack) Sheu, San Jose, CA (US); Shianling Wu, Princeton Junction, NJ (US)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/122,244

(22) Filed: May 5, 2005

(65) Prior Publication Data

US 2006/0064614 A1   Mar. 23, 2006

Related U.S. Application Data

(60) Provisional application No. 60/573,341, filed on May 24, 2004.

(51) Int. Cl.
  *G01R 31/3177* (2006.01)
  *G01R 31/40* (2006.01)
(52) U.S. Cl. .................. 714/726; 714/729; 714/733
(58) Field of Classification Search ........... 714/726, 714/731, 739, 724, 733, 715
  See application file for complete search history.

(56) References Cited

U.S. PATENT DOCUMENTS

| | | | |
|---|---|---|---|
| 6,327,684 B1 * | 12/2001 | Nadeau-Dostie et al. ..... | 714/731 |
| 6,327,687 B1 | 12/2001 | Rajski et al. | |
| 6,611,933 B1 | 8/2003 | Koenemann et al. | |
| 6,684,358 B1 * | 1/2004 | Rajski et al. ................ | 714/739 |
| 2002/0120896 A1 * | 8/2002 | Wang et al. ................ | 714/731 |
| 2003/0154433 A1 | 8/2003 | Wang et al. | |
| 2005/0097413 A1 * | 5/2005 | Ravi et al. .................. | 714/724 |
| 2005/0268194 A1 * | 12/2005 | Wang et al. ................. | 714/733 |

OTHER PUBLICATIONS

Poehl et al., Industrial experience with adoption of edt for low-cost test without concessions, International Test Conference, Sep. 2003, vol. 1, pp. 1211-1220.*
K.-J. Lee et al, "Broadcasting Test Patterns to Multiple Circuits", *IEEE Transactions on Computer-Aided Design of Integrated Circuits and Systems*, vol. 18, No. 12, pp. 1793-1802, Dec. 1999.
Pandey et al, "An Incremental Algorithm for Test Generation in Illinois Scan Architecure Based Designs," Proc., IEEE 2002 Design. Automation and Test in Europe, pp. 368-375, 2002.
B. Koenemann, "LFSR-Coded Test Patterns for Scan Designs", *Proc., European Test Conf.*, pp. 237-242, 1991.

* cited by examiner

*Primary Examiner*—Cynthia Britt
*Assistant Examiner*—Dipakkumar Gandhi
(74) *Attorney, Agent, or Firm*—Bacon & Thomas, PLLC

(57) ABSTRACT

A pipelined scan compression method and apparatus for reducing test data volume and test application time in a scan-based integrated circuit without reducing the speed of the scan chain operation in scan-test mode or self-test mode. The integrated circuit contains one or more scan chains, each scan chain comprising one or more scan cells coupled in series. A decompressor is embedded between N scan chains and M scan chains, where N<M, to broadcast compressed scan data patterns driven through the N scan chains into decompressed scan data patterns stored in the M scan chains. To speed up the shift-in/shift-out operation during decompression, the decompressor can be further split into two or more pipelined decompressors each placed between two sets of intermediate scan chains. The invention further comprises one or more pipelined compressors to speed up the shift-in/shift-out operation during compression.

40 Claims, 10 Drawing Sheets

METHOD AND APPARATUS FOR PIPELINED SCAN COMPRESSION

RELATED APPLICATION DATA

This application claims the benefit of U.S. Provisional Application No. 60/573,341 filed May 24, 2004.

FIELD OF THE INVENTION

The present invention generally relates to the field of logic design and test using design-for-test (DFT) techniques. Specifically, the present invention relates to the field of logic test and diagnosis for integrated circuits using scan or built-in self-test (BIST) techniques.

BACKGROUND

Different scan compression techniques have emerged for compressing scan data patterns, generated using automatic test-pattern generation (ATPG) tools, for reducing both test application time and test data volume. Current scan compression techniques rely on inserting a decompressor between a limited number of compressed scan inputs and a large number of internal scan chains. The decompressor can be designed as a combinational circuit that generates decompressed scan data patterns for the internal scan chains depending on the compressed scan data patterns applied to the compressed scan inputs, or as a sequential circuit that can be used to generate the decompressed scan data patterns for the internal scan chains based on previously stored states of the sequential elements.

Reference is made to the following:

U.S. Patent Documents

| | | |
|---|---|---|
| 6,327,687 | Dec. 1, 2001 | Rajski et al |
| 6,611,933 | August 2003 | Koenemann et al |
| 20030154433 | August 2003 | Wang et al |

Other Publications

K.-J. Lee et al, "Broadcasting Test Patterns to Multiple Circuits", *IEEE Transactions on Computer-Aided Design of Integrated Circuits and Systems*, Vol. 18, No. 12, pp. 1793-1802, December 1999.

A. R. Pandey et al, "An Incremental Algorithm for Test Generation in Illinois Scan Architecture Based Designs," Proc., IEEE 2002 Design, Automation and Test in Europe (DATE), pp. 368-375-2002.

B. Koenemann, "LFSR-Coded Test Patterns for Scan Designs", Proc., European Test Conf., pp. 237-242, 1991.

Scan compression techniques utilizing a combinational decompressor typically consist of an exclusive-OR (XOR) or multiplexor (MUX) tree that may be controlled by additional control inputs or controlled by an internally stored state. See the patent co-authored by Koenemann et al (2003) and the patent application co-authored by Wang et al (2003). Scan compression techniques utilizing a sequential decompressor typically embed a linear-feedback shift register (LFSR) between the compressed scan inputs and internal scan chains and use the compressed scan inputs to control the LFSR in a way that makes it generate the required decompressed scan data patterns, while utilizing "don't care" states present in the decompressed scan data patterns to reduce the complexity of the problem. See the paper co-authored by Koenemann et al (1991) and the patent co-authored by Rajski et al (2001).

In general, scan compression techniques utilizing a sequential decompressor such as an LFSR circuit are difficult to use, requiring additional software to solve the linear equations involved in order to translate the decompressed scan data patterns into the external compressed scan data patterns that can be used to generate the required decompressed scan data patterns through the LFSR. In some cases, these linear equations can turn out to be unsolvable, requiring multiple iterative runs where the decompressed scan data patterns are reordered, duplicated, or regenerated in order to be able to generate compressed scan data patterns which covers all the required faults. This can result in a significant computational overhead. In general, the compression capability of these techniques is limited since it requires that the decompressed scan data patterns be generated loosely in order to guarantee that the compression equations can be solved. This results in compressing decompressed scan data patterns that are sub-optimal, as opposed to compressing tightly packed decompressed scan data patterns where both static and dynamic compaction are performed aggressively. Finally, any changes made to the circuit after generating the decompressed scan data patterns require abandoning these patterns and going back to the beginning of the iterative process. This makes these techniques much less attractive than techniques utilizing a combinational decompressor, built mainly out of XOR or MUX gates.

Current techniques utilizing a combinational decompressor, such as circuits built out of XOR or MUX gates, utilize different combinational circuit designs for generating the decompressed scan data patterns. In some techniques, the decompressed scan data patterns are generated such that the decompressed scan data patterns for each internal scan chain depends on multiple compressed scan inputs. In other techniques, the decompressed scan data patterns for each internal scan chain depends on only one compressed scan input, with a few additional control inputs used to alter the relationship for different scan patterns. Finally, in some techniques, sequential elements are used in place of the additional control inputs to alter the relationship for different scan patterns. These sequential elements are typically preloaded with different data for each scan pattern. The advantage of these techniques is that the relationship between the decompressed scan data patterns and the compressed scan data patterns is easy to define and understand, and can be easily incorporated into the ATPG tools as part of the vector generation process, such that the compressed scan data patterns are generated automatically, with dynamic compaction being aggressively applied.

The main difficulty with current decompression solutions utilizing a combinational decompressor is that the decompression is typically done in one stage, which is placed between the compressed scan inputs and the first scan cell of each internal scan chains. This introduces a long combinational path between the compressed scan inputs and the internal scan cells, which slows down the speed at which the scan chains can be operated.

For example, a design including 8 compressed scan inputs and 512 internal scan chains (1 to 64 ratio) requires 6 levels of XOR gates, XOR gates being among the slowest combinational logic library cells. An additional delay is further introduced due to the fact that the first scan cell is typically located at a distance from the compressed scan inputs. Finally, since the compressed scan inputs are typically shared in normal mode, this can result in overloading the input pins and reducing the amount of time these pins can be operated at, which can adversely affect the regular chip functionality. The same problems exist in combinational decompressors utilizing MUX gates as their basic building block.

A similar problem exists when the scan data responses captured in the internal scan chains are compressed into compressed scan data responses driven out on a smaller number of compressed scan outputs. For compression techniques utilizing a sequential compressor, difficulties arise due to the fact that all unknowns now have to be accounted for and tolerated in scan mode (during shift-in and shift-out operations), which can result in a significant gate overhead for scan designs utilizing these techniques. For designs utilizing a combinational compressor, a similar number of XOR gate levels may have to be placed between the last scan cell of the internal scan chains and the compressed scan outputs, creating similar delays and loading problems as the combinational decompressor used on the input side. The same problems also exist in combinational compressor designs utilizing MUX gates as their basic building block.

Accordingly, there is a need to develop an improved method and apparatus for scan compression. The method we propose in this invention is based on pipelining the decompressor and compressor and placing them in between the scan cells of the scan-based design.

SUMMARY OF THE INVENTION

Accordingly, in this invention, we solve the difficulties that arise from using a combinational decompressor and compressor by splitting the decompressor and compressor into intermediate decompressors and compressors and pipelining the intermediate decompressors and compressors by embedding them between the scan cells of the scan design somewhere at the beginning and at the end of the internal scan chains, respectively. This pipelining can be implemented using any number of intermediate decompressors and compressors depending on the speed that the scan chains are required to operate.

For example, for the design comprising 8 compressed scan inputs and 512 internal scan chains, the combinational decompressor can be inserted such that the 8 compressed scan inputs drive 8 intermediate scan chains each comprising one internal scan cell. These 8 scan cells in turn are used to drive another 16 intermediate scan chains each comprising one internal scan cell through one level of XOR gates that comprise the first intermediate decompressor. Next, these 16 scan cells are used to drive 32 internal scan cells through one-level of XOR gates that comprise the second intermediate decompressor, and this process is repeated until we reach the required 512 internal scan chains. Alternately, compressed scan input pin loading can be reduced by embedding the decompressor as one level of logic after an initial set of scan cells. A similar process is used to pipeline the combinational compressor at the end of the scan chains through multiple levels of scan cells and intermediate compressors, and a similar process is used to pipeline combinational decompressors and compressors which utilize MUX gates as their basic building block.

The main advantage of this technique is that since the decompressor and compressor are now pipelined, it is possible to perform scan compression where a maximum of one XOR or MUX gate is placed between any two scan cells, by dividing the long path between the compressed scan inputs and outputs and the internal scan chains over multiple levels of scan cells and intermediate decompressors and compressors. This allows us to perform compressed scan at a similar speed as regular scan. A further advantage is that it allows us to better balance scan chains, by performing the scan decompression and compression at different lengths for different scan chains. This allows us to control all scan chains to be the same length regardless of the number of scan cells controlled by each compressed scan input. Finally, scan cells that are needed to test faults that are hard to detect can be excluded from the scan compression process by placing them either before the pipelined decompressor, or after the pipelined compressor, which allows us to guarantee that the decompressor and compressor will not interfere with the testing of these faults.

BRIEF DESCRIPTION OF DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
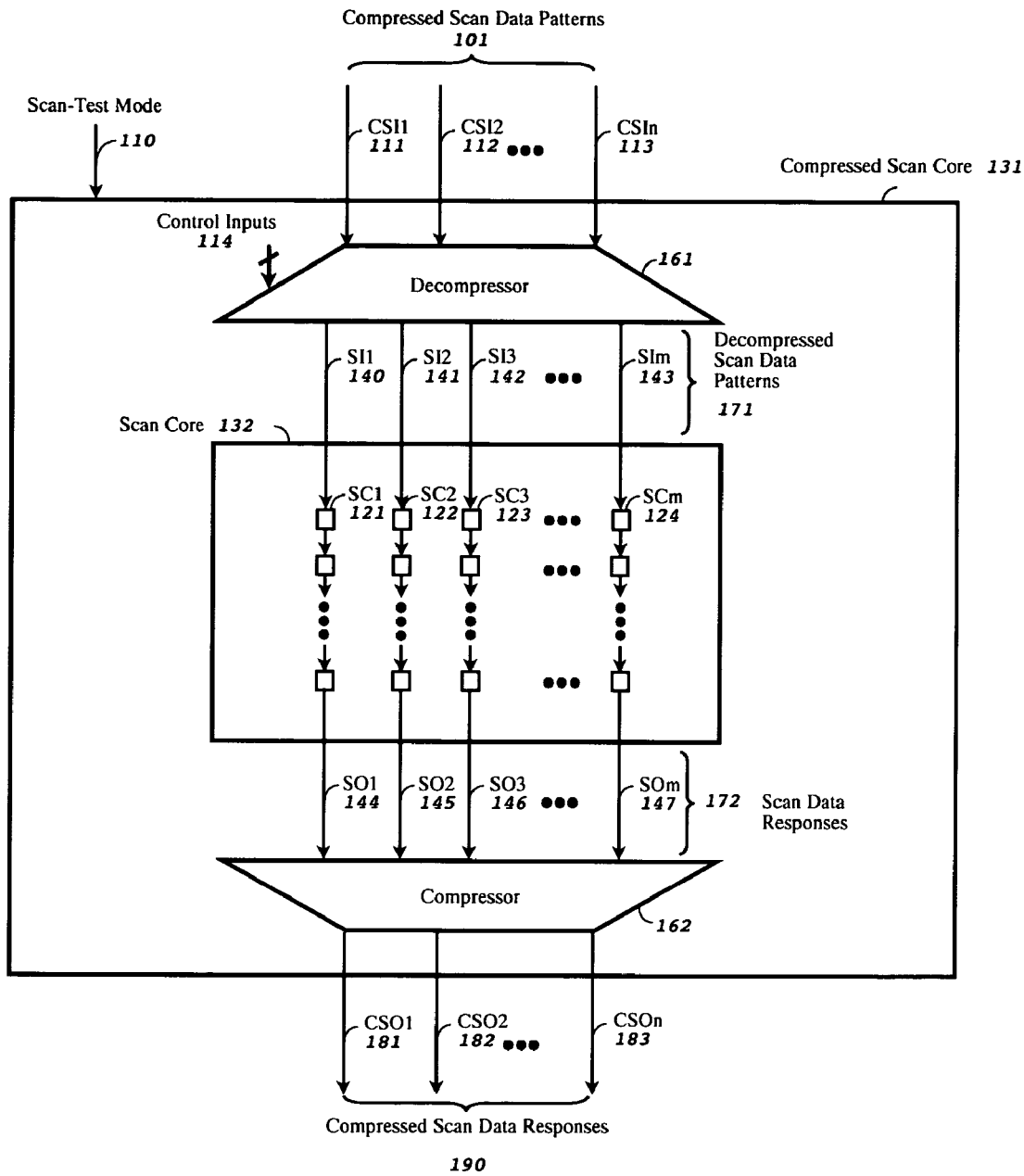
FIG. 1 shows a prior-art compressed scan test system for testing scan-based integrated circuits with compressed scan data patterns using an ATE (automatic test equipment)

FIG. 1 shows a prior-art compressed scan test system for testing scan-based integrated circuits with compressed scan data patterns using an ATE (automatic test equipment). The Compressed Scan Core 131 comprises a Scan Core 132 surrounded by a Decompressor 161 and Compressor 162. It further accepts a Scan-Test Mode 110 signal, and Compressed Scan Data Patterns 101 applied on external compressed scan inputs CSI1 111 to CSIn 113 to drive the Decompressor 161. The Decompressor 161 also accepts Control Inputs 114 to control the Decompressor during scan-test. The Decompressor accepts the Compressed Scan Data Patterns 101 and generates Decompressed Scan Data Patterns 171 on the internal scan chain inputs SI1 140 to SIm 143 to drive the scan chains SC1 121 to SCm 124 embedded in Scan Core 132. Scan chain outputs SO1 144 to SOm 147 are then used to drive Compressor 162 to compact the Scan Data Responses 172 into Compressed Scan Data Responses 190 driven out of the Compressed Scan Core 131 on external compressed scan outputs CSO1 181 to CSOn 183. In this prior-art compressed scan test system, the ATE generates and applies the Compressed Scan Data Patterns 101 to the Compressed Scan Core 131, and accepts the Compressed Scan Data Responses 190 for comparison.

Figure 2:
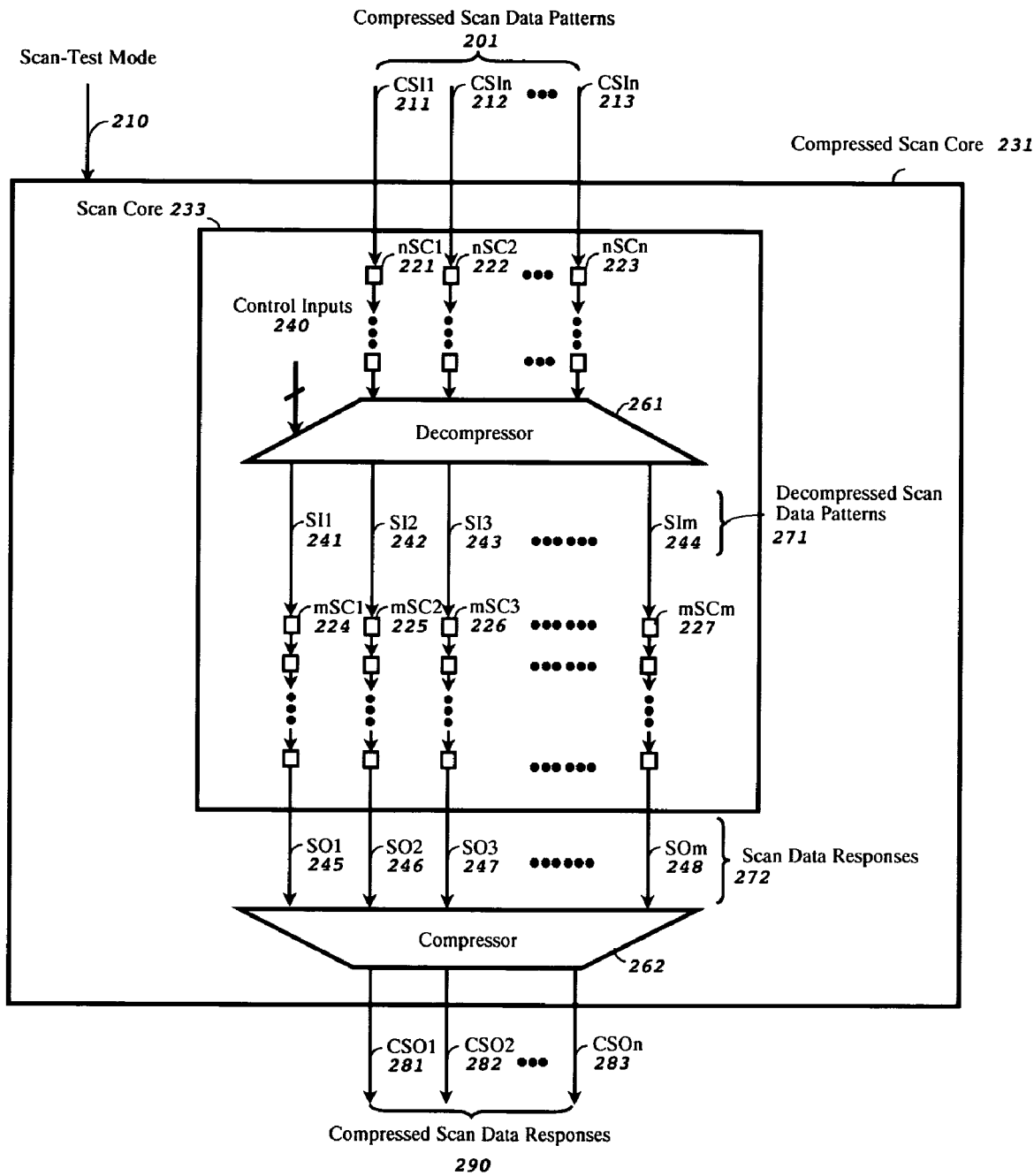
FIG. 2 shows a first embodiment of a pipelined compressed scan test system, in accordance with the present invention, for testing scan-based integrated circuits.

FIG. 2 shows a first embodiment of a pipelined compressed scan test system, in accordance with the present invention, for testing scan-based integrated circuits. The Compressed Scan Core 231 comprises a Scan Core 233 followed by a Compressor 262. Furthermore, the Scan Core 233 comprises N scan chains nSC1 221 to nSCn 223, M scan chains mSC1 224 to mSCm 227 with the Decompressor 261 embedded within the Scan Core 233, between the N scan chains and M scan chains. The Compressed Scan Core 231 further accepts a Scan-Test Mode 210 signal, and Compressed Scan Data Patterns 201 applied on external compressed scan inputs CSI1 211 to CSIn 213 to drive the N scan chains nSC1 221 to nSCn 223. The N scan chains outputs are used to drive the Decompressor 261, which also accepts Control Inputs 240 to control the Decompressor during scan-test. The Decompressor 261 reads in the Compressed Scan Data Patterns 201 after passing through the N scan chains and generates Decompressed Scan Data Patterns 271 on the internal M scan chain inputs SI1 241 to SIm 244 to drive the M scan chains mSC1 224 to mSCm 227 embedded in the Scan Core 233.

The M scan chain outputs SO1 245 to SOm 248 are then used to drive Compressor 262 to compact the Scan Data Responses 272 into Compressed Scan Data Responses 290 driven out of the Compressed Scan Core 231 on external compressed scan outputs CSO1 281 to CSOn 283.

In this first embodiment of a pipelined compressed scan test system, the Compressed Scan Data Patterns 201 are either generated externally on an ATE during scan-test, or generated internally using a PRPG (pseudorandom pattern generator) or RPG (random pattern generator) during self-test. Similarly, the Compressed Scan Data Responses 290 are either compared externally on an ATE during scan-test, or compacted internally using a MISR (multiple-input signature register) during self-test.

Figure 3:
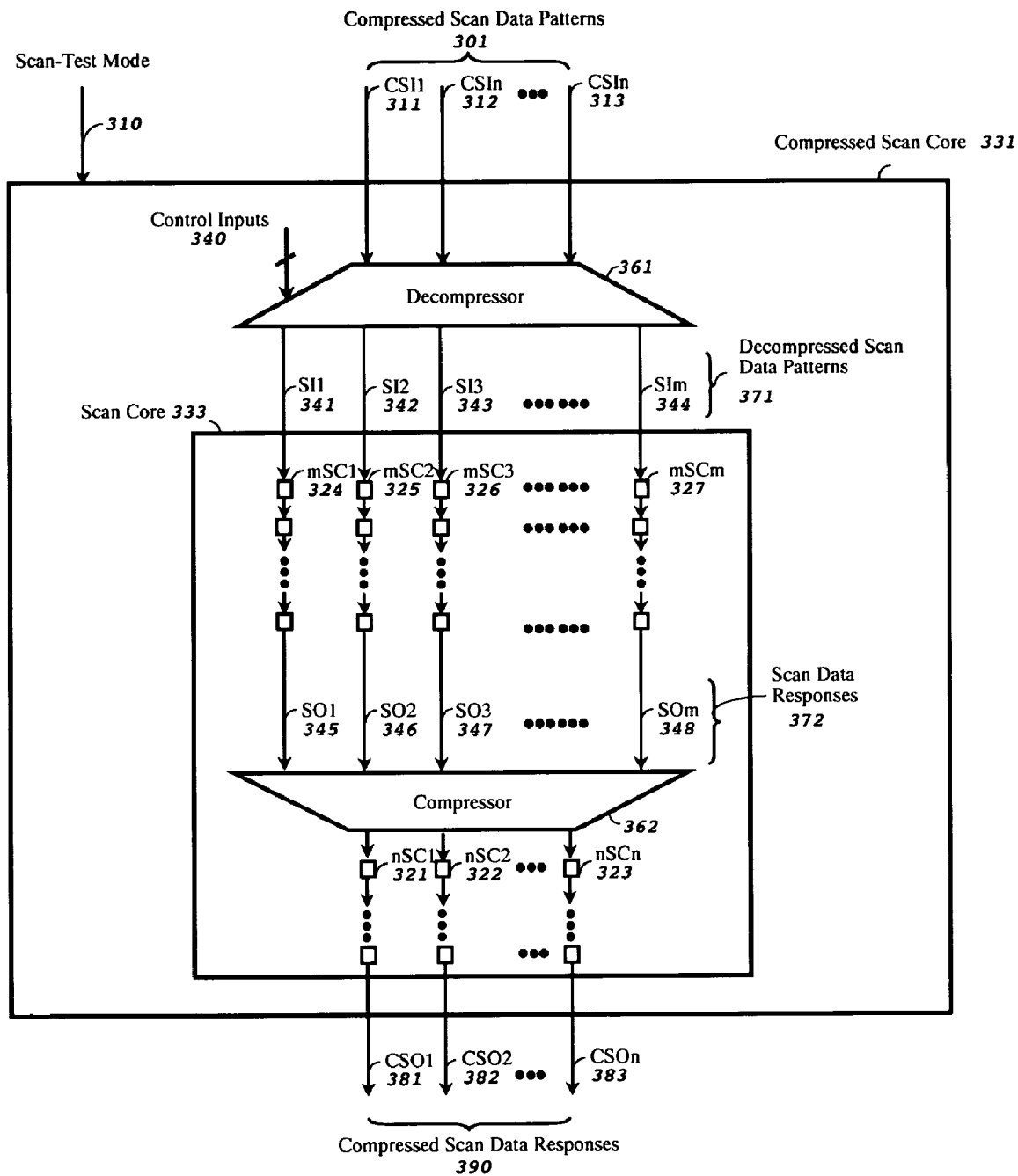
FIG. 3 shows a second embodiment of a pipelined compressed scan test system, in accordance with the present invention, for testing scan-based integrated circuits.

FIG. 3 shows a second embodiment of a pipelined compressed scan test system, in accordance with the present invention, for testing scan-based integrated circuits. The Compressed Scan Core 331 comprises a Decompressor 361 followed by a Scan Core 333. Furthermore, the Scan Core 333 comprises M scan chains mSC1 324 to mSCm 327, N scan chains nSC1 321 to nSCn 323 with the Compressor 362 embedded within the Scan Core 333, between the M scan chains and N scan chains. The Compressed Scan Core 331 further accepts a Scan-Test Mode 310 signal, and Compressed Scan Data Patterns 301 applied on external compressed scan inputs CSI1 311 to CSIn 313 to drive the Decompressor 361. The Decompressor 361 also accepts Control Inputs 340 to control the Decompressor 361 during scan-test. The Decompressor 361 accepts the Compressed Scan Data Patterns 301 and generates Decompressed Scan Data Patterns 371 on the internal scan chain inputs SI1 341 to SIm 344 to drive the M scan chains mSC1 324 to mSCm 327 embedded in Scan Core 333.

The M scan chain outputs SO1 345 to SOm 348 are then used to drive Compressor 362 embedded in the Scan Core 333 to compact the Scan Data Responses 372 into Compressed Scan Data Responses 390, after passing through the N scan chains nSC1 321 to nSCn 323, which are driven out of the Compressed Scan Core 331 on external compressed scan outputs CSO1 381 to CSOn 383.

In this second embodiment of a pipelined compressed scan test system, the Compressed Scan Data Patterns 301 are either generated externally on an ATE during scan-test, or generated internally using a PRPG or RPG during self-test. Similarly, the Compressed Scan Data Responses 390 are either compared externally on an ATE during scan-test, or compacted internally using a MISR during self-test.

Figure 4:
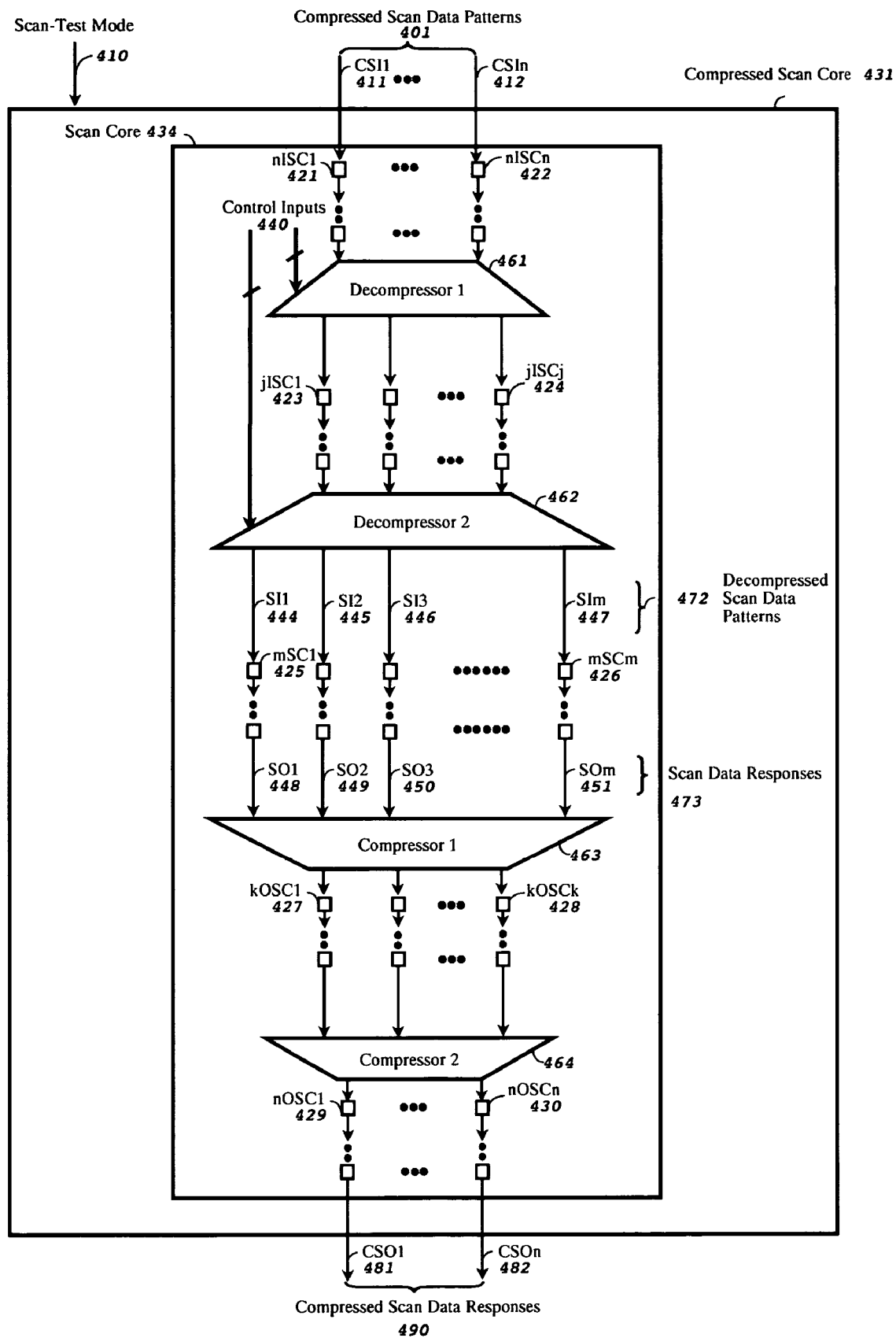
FIG. 4 shows a third embodiment of a pipelined compressed scan test system, in accordance with the present invention, for testing scan-based integrated circuits.

FIG. 4 shows a third embodiment of a pipelined compressed scan test system, in accordance with the present invention, for testing scan-based integrated circuits. The Compressed Scan Core 431 comprises a Scan Core 434 with two intermediate decompressors Decompressor1 461 and Decompressor2 462 and two intermediate compressors Compressor1 463 and Compressor2 464 embedded in the Scan Core 434. Furthermore, the Decompressor circuit is split and pipelined among the internal scan chains using the two intermediate decompressors, Decompressor1 461 and Decompressor2 462. Also, the Compressor circuit is split and pipelined among the internal scan chains using the two intermediate compressors, Compressor1 463 and Compressor2 464. The Scan Core 434 also comprises N input scan chains nISC1 421 to nISCn 422, J internal input scan chains jISC1 423 to jISCj 424 embedded between the intermediate stages of the pipelined Decompressor, M scan chains mSC1 425 to mSCm 426, K internal output scan chains kOSC1 427 to kOSCk 428 embedded between the intermediate stages of the pipelined Compressor, and N output scan chains nOSC1 429 to nOSCn 430.

The Compressed Scan Core 431 further accepts a Scan-Test Mode 410 signal, and Compressed Scan Data Patterns 401 applied on external compressed scan inputs CSI1 411 to CSIn 412 to drive the N input scan chains nISC1 421 to nISCn 422. The N input scan chains outputs are used to drive the first intermediate decompressor Decompressor1 461, which also accepts Control Inputs 440 to control the Decompressor1 461 during scan-test. The Decompressor1 461 reads in the Compressed Scan Data Patterns 401 after passing through the N input scan chains and its outputs are used to drive the second intermediate decompressor Decompressor2 462 after passing through the J internal input scan chains jISC1 423 to jISCj 424 to generate Decompressed Scan Data Patterns 472 on the internal M scan chain inputs SI1 444 to SIm 447 to drive the M scan chains mSC1 425 to mSCm 426 embedded in Scan Core 434.

The M scan chain outputs SO1 448 to SOm 451 are then used to drive the first intermediate compressor Compressor1 463, and its outputs are used to drive the second intermediate compressor Compressor2 464 after passing through the K internal output scan chains kOSC1 427 to kOSCk 428 to compact the Scan Data Responses 473 into Compressed Scan Data Responses 490, which are driven out of the Compressed Scan Core 431 on external compressed scan outputs CSO1 481 to CSOn 482 after passing through the N output scan chains nOSC1 429 to nOSCn 430.

In this third embodiment of a pipelined compressed scan test system, the Compressed Scan Data Patterns 401 are either generated externally on an ATE during scan-test, or generated internally using a PRPG or RPG during self-test. Similarly, the Compressed Scan Data Responses 490 are either compared externally on an ATE during scan-test, or compacted internally using a MISR during self-test.

Figure 5:
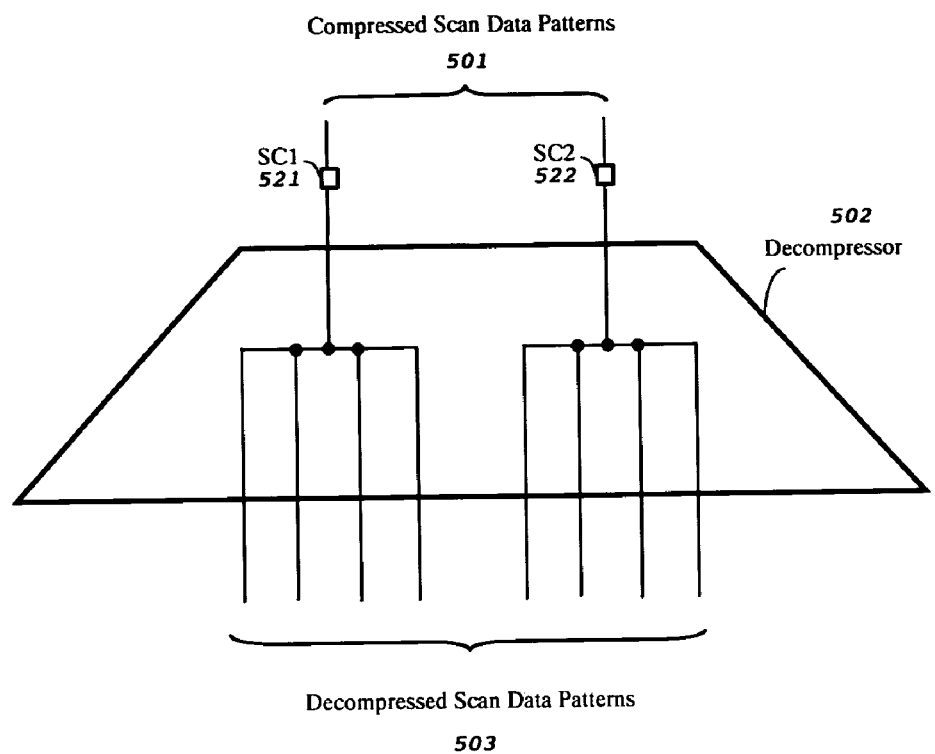
FIG. 5 shows a first embodiment of a pipelined decompressor, in accordance with the present invention.

FIG. 5 shows a first embodiment of a pipelined decompressor, in accordance with the present invention. The Decompressor 502 accepts Compressed Scan Data Patterns 501 driven through scan cells SC1 521 and SC2 522, and broadcasts them over multiple outputs to generate Decompressed Scan Data Patterns 503.

Figure 6:
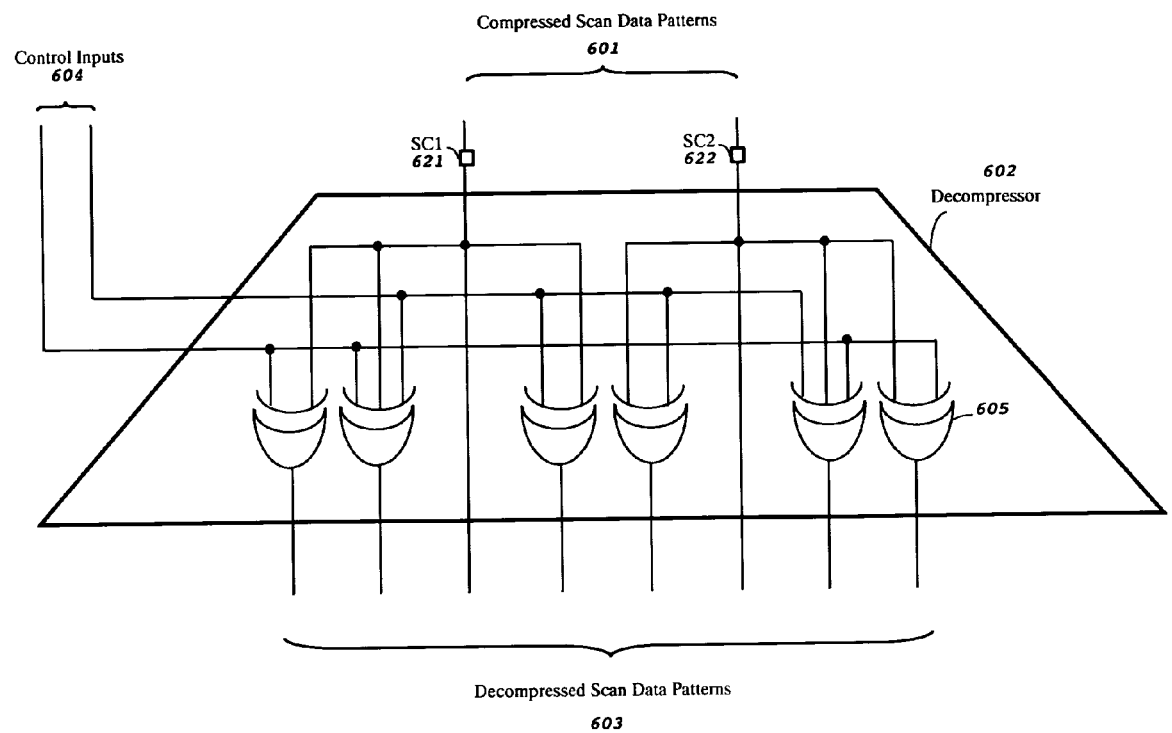
FIG. 6 shows a second embodiment of a pipelined decompressor, in accordance with the present invention.

FIG. 6 shows a second embodiment of a pipelined decompressor, in accordance with the present invention. The Decompressor 602 accepts Compressed Scan Data Patterns 601 driven through scan cells SC1 621 and SC2 622, and Control Inputs 604 to generate Decompressed Scan Data Patterns 603 by utilizing exclusive-OR (XOR) gates 605. The optional Control Inputs 604 are used to alter the relationship for different scan patterns, in order to improve fault coverage and fault diagnosis.

Figure 7:
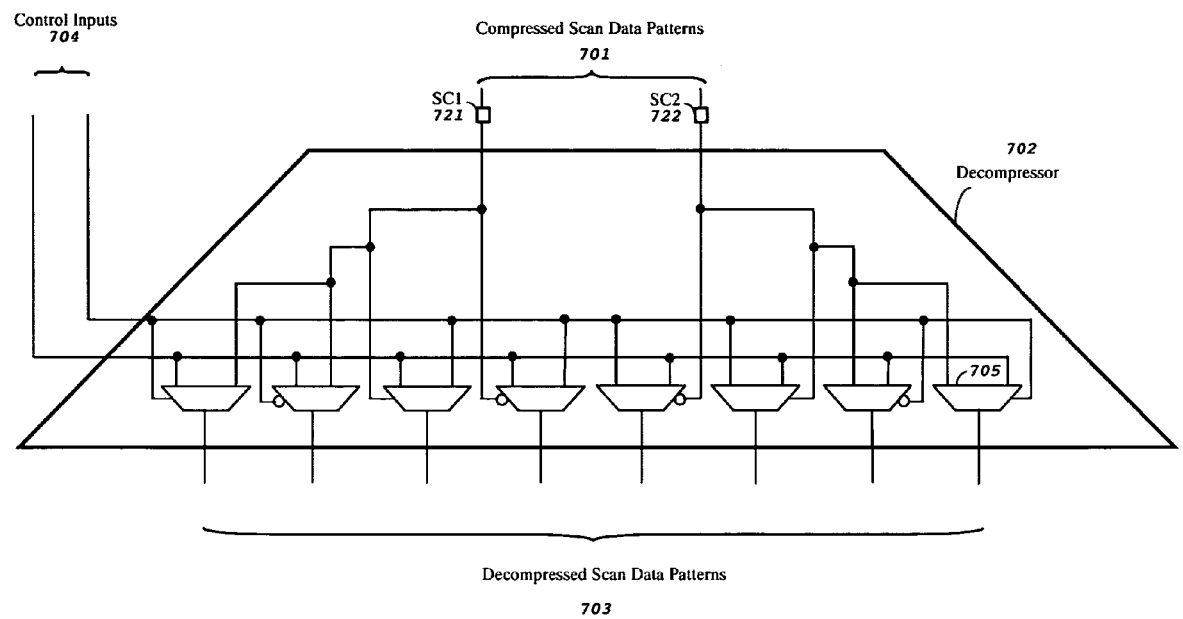
FIG. 7 shows a third embodiment of a pipelined decompressor, in accordance with the present invention.

FIG. 7 shows a third embodiment of a pipelined decompressor, in accordance with the present invention. The Decompressor 702 accepts Compressed Scan Data Patterns 701 driven through scan cells SC1 721 and SC2 722, and Control Inputs 704 to generate Decompressed Scan Data Patterns 703 by utilizing multiplexor (MUX) gates 705. The optional Control Inputs 704 are used to alter the relationship for different scan patterns, in order to improve fault coverage and fault diagnosis.

Figure 8:
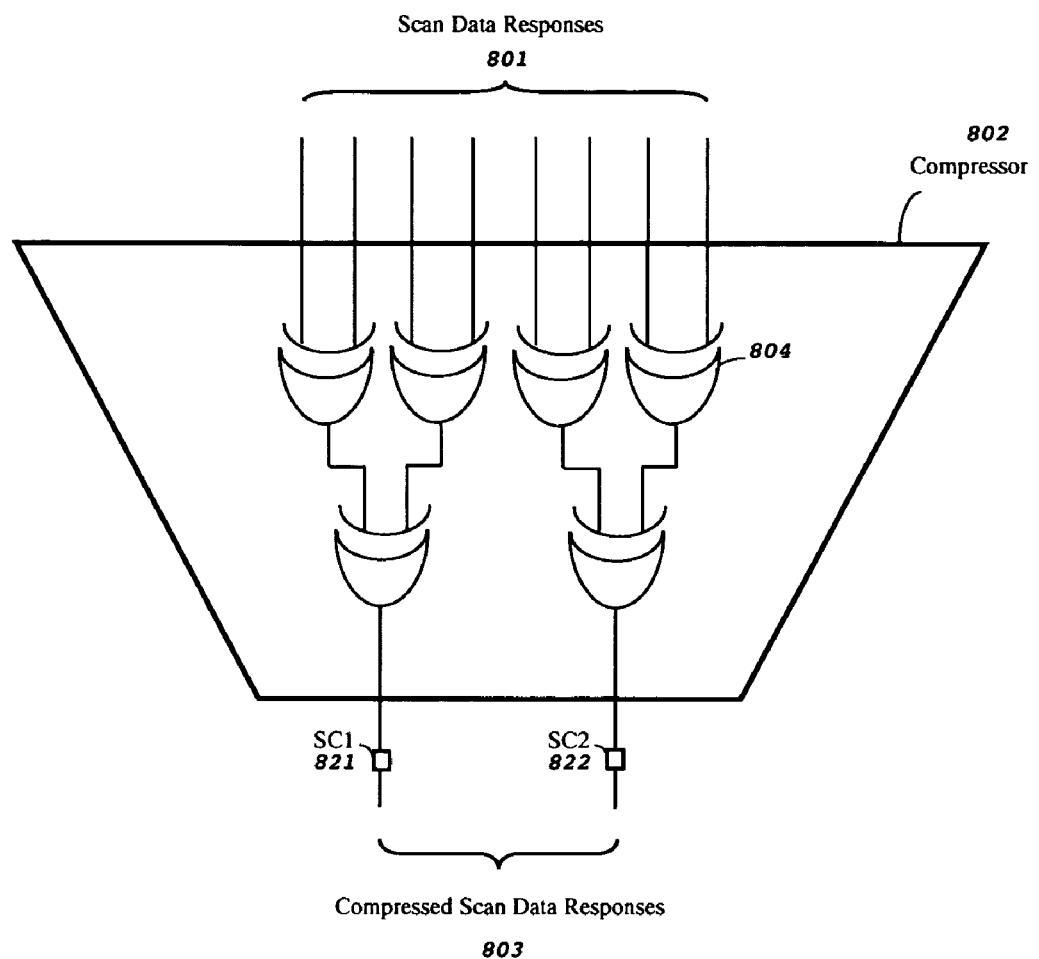
FIG. 8 shows a first embodiment of a pipelined compressor, in accordance with the present invention.

FIG. 8 shows a first embodiment of a pipelined compressor, in accordance with the present invention. The Compressor 802 accepts Scan Data Responses 801 to generate Compressed Scan Data Responses 803 after passing through scan cells SC1 821 and SC2 822, by utilizing exclusive-OR (XOR) gates 804. A compressor utilizing an X-tolerant XOR network, having at least one internal scan chain output connected to two or more XOR gates, is also included within the scope of this invention.

Figure 9:
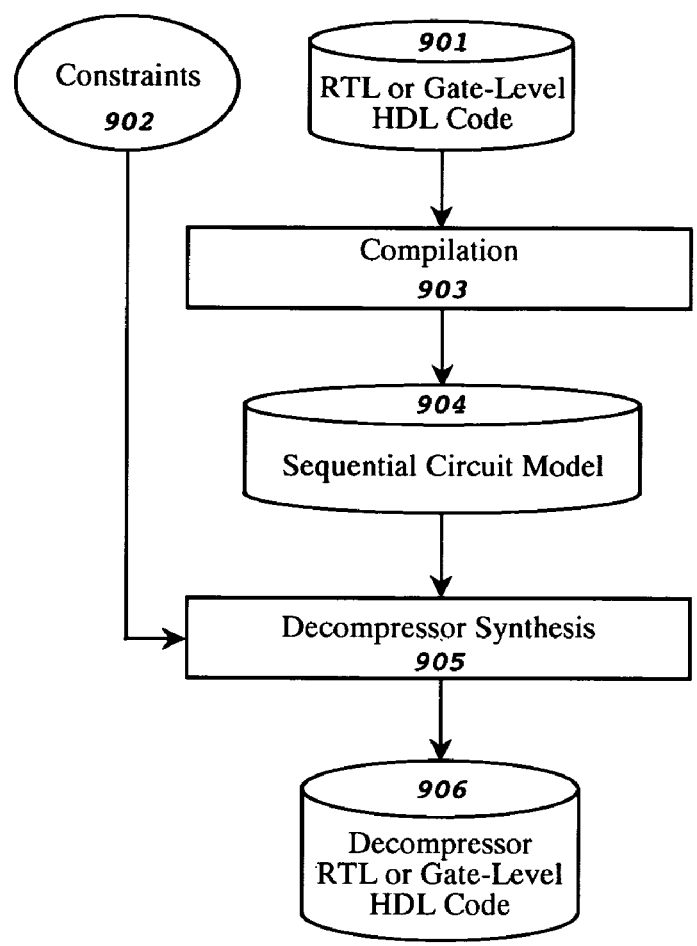
FIG. 9 shows a flow diagram of a method for synthesizing a decompressor in either RTL (register-transfer level) or gate-level, in accordance with the present invention.

FIG. 9 shows a flow diagram of a method for synthesizing a decompressor in either RTL (register-transfer level) or gate-level, in accordance with the present invention. In this flow diagram, RTL or Gate-Level HDL Code 901 goes through Compilation 903 to generate Sequential Circuit Model 904. Next, Decompressor Synthesis 905 is performed according to Sequential Circuit Model 904 and Constraints 902 to generate Decompressor RTL or Gate-Level HDL Code 906. The Decompressor RTL or Gate-Level HDL Code 906 is generated as a combinational logic network comprising any combination of logic gates, such as AND gates, OR gates, NAND gates, NOR gates, XOR gates, XNOR gates, multiplexers, buffers, and inverters.

Figure 10:
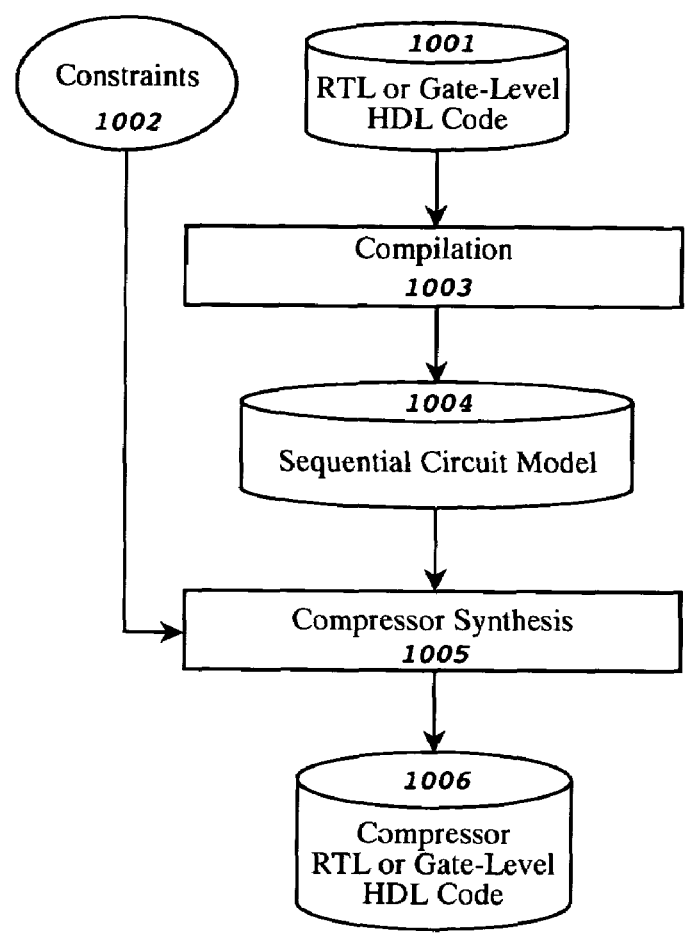
FIG. 10 shows a flow diagram of a method for synthesizing a compressor in either RTL (register-transfer level) or gate-level, in accordance with the present invention.

FIG. 10 shows a flow diagram of a method for synthesizing a compressor in either RTL (register-transfer level) or gate-level, in accordance with the present invention. In this flow diagram, RTL or Gate-Level HDL Code 1001 goes through Compilation 1003 to generate Sequential Circuit Model 1004. Next, Compressor Synthesis 1005 is performed according to Sequential Circuit Model 1004 and Constraints 1002 to generate Compressor RTL or Gate-Level HDL Code 1006. The Compressor RTL or Gate-Level HDL Code 1006 is generated as a combinational logic network comprising any combination of logic gates, such as AND gates, OR gates, NAND gates, NOR gates, XOR gates, XNOR gates, multiplexers, buffers, and inverters.

Having thus described presently preferred embodiments of the present invention, it can now be appreciated that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for broadcasting compressed scan data patterns driven through N scan chains into decompressed scan data patterns stored in M scan chains, where N<M, using a decompressor, in a scan-based integrated circuit, in a selected scan-test mode or selected self-test mode, the scan-based integrated circuit containing one or more scan chains, each scan chain comprising one or more scan cells coupled in series, one of said scan cells having an output coupled exclusively to the decompressor, the decompressor being a combinational logic network whose inputs are directly taken from N or more selected scan cell outputs of all scan cells in the N scan chains and whose outputs directly drive the M scan chains; said method comprising:

(a) shifting in said decompressed scan data patterns to all said scan cells in said scan-based integrated circuit by broadcasting said compressed scan data patterns driven through said N scan chains into said decompressed scan data patterns stored in said M scan chains using said decompressor during a shift-in operation;
   (b) capturing a scan data response to all said scan cells during a selected capture operation; and
   (c) shifting out said scan data response for comparison or compaction during a shift-out operation.

2. The method of claim 1, wherein said shifting in said decompressed scan data patterns to all said scan cells further comprises generating said compressed scan data patterns on an ATE (automatic test equipment) in said selected scan-test mode.

3. The method of claim 1, wherein said shifting in said decompressed scan data patterns to all said scan cells further comprises automatically generating said compressed scan data patterns internally using a selected pattern generator in said selected self-test mode.

4. The method of claim 3, wherein said selected pattern generator is selectively a pseudorandom pattern generator (PRPG) or a random pattern generator (RPG).

5. The method of claim 1, wherein said decompressor is pipelined using two or more intermediate decompressor stages for broadcasting said compressed scan data patterns driven through said N scan chains into said decompressed scan data patterns stored in said M scan chains by going through said two or more intermediate decompressor stages, and one or more sets of intermediate scan chains $M_1$ to $M_k$, where k>=1.

6. The method of claim 1, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

7. The method of claim 1, wherein said decompressor further accepts a set of control inputs to dynamically control said decompressor, wherein said control inputs are selectively driven by primary inputs or generated internally.

8. The method of claim 1, wherein said shift-in operation and said shift-out operation occur concurrently.

9. An apparatus for broadcasting compressed scan data patterns driven through N scan chains into decompressed scan data patterns stored in M scan chains, where N<M, using a decompressor, in a scan-based integrated circuit, in a selected scan-test mode or selected self-test mode, the scan-based integrated circuit containing one or more scan chains, each scan chain comprising one or more scan cells coupled in series, and one of said scan cells having an output coupled exclusively to the decompressor; said apparatus characterized by:

(a) said decompressor being a combinational logic network whose inputs are directly taken from N or more selected scan cell outputs of all scan cells in the N scan chains and whose outputs directly drive the M scan chains.

10. The apparatus of claim 9, wherein said compressed scan data patterns are generated on an ATE (automatic test equipment) in said selected scan-test mode.

11. The apparatus of claim 9, wherein said compressed scan data patterns are generated internally using a selected pattern generator in said selected self-test mode.

12. The apparatus of claim 11, wherein said selected pattern generator is selectively a pseudorandom pattern generator (PRPG) or a random pattern generator (RPG).

13. The apparatus of claim 9, wherein said decompressor is pipelined using two or more intermediate decompressor stages for broadcasting said compressed scan data patterns driven through said N scan chains into said decompressed scan data patterns stored in said M scan chains by going through said two or more intermediate decompressor stages, and one or more sets of intermediate scan chains $M_1$ to $M_k$, where k>=1.

14. The apparatus of claim 9, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

15. The apparatus of claim 9, wherein said decompressor further accepts a set of control inputs to dynamically control said decompressor, wherein said control inputs are selectively driven by primary inputs or generated internally.

16. A method for synthesizing a decompressor embedded between N scan chains and M scan chains in a scan-based integrated circuit, in a selected scan-test mode or selected self-test mode, the scan-based integrated circuit containing a plurality of scan chains, each scan chain comprising one or more scan cells coupled in series, and one of said scan cells having an output coupled exclusively to the decompressor; the decompressor being a combinational logic network whose inputs are directly taken from N or more selected scan cell outputs of all scan cells in the N scan chains and whose outputs directly drive the M scan chains; said method comprising the computer-implemented steps of:
(a) compiling the RTL (register-transfer level) or gate-level HDL (hardware description language) code that represents said scan-based integrated circuit into a sequential circuit model;
(b) specifying a list of constraints on said decompressor;
(c) synthesizing said decompressor embedded between said N scan chains and said M scan chains in said scan-based integrated circuit; and
(d) generating the decompressor RTL or gate-level HDL code.

17. The method of claim 16, wherein said decompressor is pipelined using two or more intermediate decompressor stages and one or more sets of intermediate scan chains $M_1$ to $M_k$, where k>=1.

18. The method of claim 16, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

19. The method of claim 16, wherein said decompressor further accepts a set of control inputs to dynamically control said decompressor, wherein said control inputs are selectively driven by primary inputs or generated internally.

20. A method for compressing scan data responses stored in M scan chains into compressed scan data responses driven through N scan chains, where N<M, using a compressor, in a scan-based integrated circuit, in a selected scan-test mode or selected self-test mode, the scan-based integrated circuit containing one or more scan chains, each scan chain comprising one or more scan cells coupled in series, the compressor being a combinational logic network whose inputs are directly taken from M or more selected scan cell outputs of all scan cells in the M scan chains and whose outputs directly drive the N scan chains; said method comprising:
(a) shifting in decompressed scan data patterns to all said scan cells in said scan-based integrated circuit during a shift-in operation;
(b) capturing said scan data responses to all said scan cells during a selected capture operation; and
(c) shifting out said scan data responses for comparison or compaction, by compressing said scan data responses stored in said M scan chains into said compressed scan data responses driven through said N scan chains using said compressor during a shift-out operation.

21. The method of claim 20, wherein said shifting out said scan data responses further comprises comparing said compressed scan data responses on an ATE (automatic test equipment) in said selected scan-test mode.

22. The method of claim 20, wherein said shifting out said scan data responses further comprises compacting said compressed scan data responses internally using a MISR (multiple-input signature register) in said selected self-test mode.

23. The method of claim 20, wherein said compressor is pipelined using two or more intermediate compressor stages for compressing said scan data responses stored in said M scan chains into said compressed scan data responses driven through said N scan chains by going through said two or more intermediate compressor stages, and one or more sets of intermediate scan chains $M_1$ to $M_k$, where k>=1.

24. The method of claim 20, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

25. The method of claim 20, wherein said compressor further accepts a set of control inputs to dynamically control said compressor, wherein said control inputs are selectively driven by primary inputs or generated internally.

26. The method of claim 20, wherein said shift-in operation and said shift-out operation occur concurrently.

27. An apparatus for compressing scan data responses stored in M scan chains into compressed scan data responses driven through N scan chains, where N<M, using a compressor, in a scan-based integrated circuit, in a selected scan-test mode or selected self-test mode, the scan-based integrated circuit containing one or more scan chains, each scan chain comprising one or more scan cells coupled in series; said apparatus comprising:
(a) the compressor being a combinational logic network whose inputs directly taken from M or more selected scan cell outputs of all scan cells in the M scan chains and whose outputs directly drive the N scan chains.

28. The apparatus of claim 27, wherein said compressed scan data test responses are compared on an ATE (automatic test equipment) in said selected scan-test mode.

29. The apparatus of claim 27, wherein said compressed scan data test responses are compacted internally using a MISR (multiple-input signature register) in said selected self-test mode.

30. The apparatus of claim 27, wherein said compressor is pipelined using two or more intermediate compressor stages for compressing said scan data responses stored in said M scan chains into said compressed scan data responses driven through said N scan chains by going through said two or more intermediate compressor stages, and one or more sets of intermediate scan chains $M_1$ to $M_k$, where k>=1.

31. The apparatus of claim 27, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

32. The apparatus of claim 27, wherein said compressor further accepts a set of control inputs to dynamically control said compressor, wherein said control inputs are selectively driven by primary inputs or generated internally.

33. A method for synthesizing a compressor embedded between M scan chains and N scan chains in a scan-based integrated circuit, in a selected scan-test mode or selected self-test mode, the scan-based integrated circuit containing a plurality of scan chains, each scan chain comprising one or more scan cells coupled in series; the compressor being a combinational logic network whose inputs are directly taken from M or more selected scan cell outputs of all scan cells in the M scan chains and whose outputs directly drive the N scan chains; said method comprising the computer-implemented steps of:
(a) compiling the RTL (register-transfer level) or gate-level HDL (hardware description language) code that represents said scan-based integrated circuit into a sequential circuit model;
(b) specifying a list of constraints on said compressor;
(c) synthesizing said compressor embedded between said M scan chains and said N scan chains in said scan-based integrated circuit; and
(d) generating the compressor RTL or gate-level HDL code.

34. The method of claim 33, wherein said compressor is pipelined using two or more intermediate compressor stages and one or more sets of intermediate scan chains $M_1$ to $M_k$, where k>=1.

35. The method of claim 33, wherein said combinational logic network comprises one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

36. The method of claim 33, wherein said compressor further accepts a set of control inputs to dynamically control said compressor, wherein said control inputs are selectively driven by primary inputs or generated internally.

37. In a system for testing integrated circuits having a plurality of internal scan chains having scan cells coupled in series and a combinational logic network decompressor and compressor, the improvement wherein at least a portion of said decompressor is embedded intermediate the beginning and end of said internal scan chains, each of said internal scan chains comprising one or more scan cells coupled in series, and one of said scan cells having an output coupled exclusively to the decompressor.

38. The system for testing defined in claim 37 wherein at least a portion of said compressor is embedded intermediate the beginning and end of said internal scan chain and after said decompressor.

39. In a system for testing integrated circuits having a plurality of internal scan chains having scan cells coupled in series and a combinational logic network decompressor and compressor, the improvement wherein at least a portion of said compressor is embedded intermediate the beginning and end of said internal scan chains.

40. The system for testing defined in claim 39 wherein at least a portion of said decompressor is embedded intermediate the beginning and end of said internal scan chain and before said compressor.

* * * * *